United States Patent [19]

Baraban et al.

[11] Patent Number: 4,685,045
[45] Date of Patent: Aug. 4, 1987

[54] DEVICE FOR FAILURE DETECTION IN SERIES-CONNECTED SEMICONDUCTOR RECTIFIERS

[75] Inventors: Viktor P. Baraban, Tallin; Stanislav G. Zabrovsky, Moscow; Albert F. Zvyagin, Tallin; Grigory B. Lazarev, Moscow; Yaak A. Tars, Tallin, all of U.S.S.R.

[73] Assignee: P/O Tallinsky Electrotekhnichesky Zavod, Tallin, U.S.S.R.

[21] Appl. No.: 900,154

[22] PCT Filed: Dec. 20, 1984

[86] PCT No.: PCT/SU84/00073
§ 371 Date: Jul. 25, 1986
§ 102(e) Date: Jul. 25, 1986

[87] PCT Pub. No.: WO86/03897
PCT Pub. Date: Jul. 3, 1986

[51] Int. Cl.⁴ ............................................. H02H 7/10
[52] U.S. Cl. ...................................... 363/68; 340/645; 363/54; 363/57
[58] Field of Search .................. 363/54, 58, 68, 57; 340/645; 307/252 L, 252 Q; 361/2, 91

[56] References Cited

U.S. PATENT DOCUMENTS 3,099,828 7/1963 Kelley .................................. 340/645
3,163,801 12/1964 Vansteenkiste ...................... 340/645

FOREIGN PATENT DOCUMENTS 1638535 10/1970 Fed. Rep. of Germany ... 307/252 L
1245685  9/1971 United Kingdom ................... 363/54
 625293  9/1978 U.S.S.R. .............................. 363/68
 957345  9/1982 U.S.S.R. .............................. 363/54
1032559  7/1983 U.S.S.R. .............................. 363/54

Primary Examiner—William H. Beha, Jr.
Attorney, Agent, or Firm—Lilling & Greenspan

[57] ABSTRACT

A device for failure detection in series-connected semiconductor rectifiers (1) comprises transformers (2) whose number is equal to that of the rectifiers (1) and which comprise input windings (3), supply windings (6), and additional parallel-connected windings (9), RC-circuits whose number is equal to that of the rectifiers (1), having resistors (4) and capacitors (5), and also a pulse generator (7), and a measuring element (8).

The input winding (3) of each transformer (2) has one lead-out thereof connected to a cathode of the respective rectifier (1), and another lead-out to the capacitor (5) of the respective RC-circuit. The resistors (4) of each RC-circuit are connected to the anodes of each rectifier (1). The supply windings (6) of the transformers (2) are connected to one another in series and connected by one terminal to the first lead-out of the pulse generator (7). The second lead-out of the pulse generator (7), together with the second terminal of the circuit comprising the series-connected supply windings (6), are connected to a measuring element (8).

1 Claim, 1 Drawing Figure

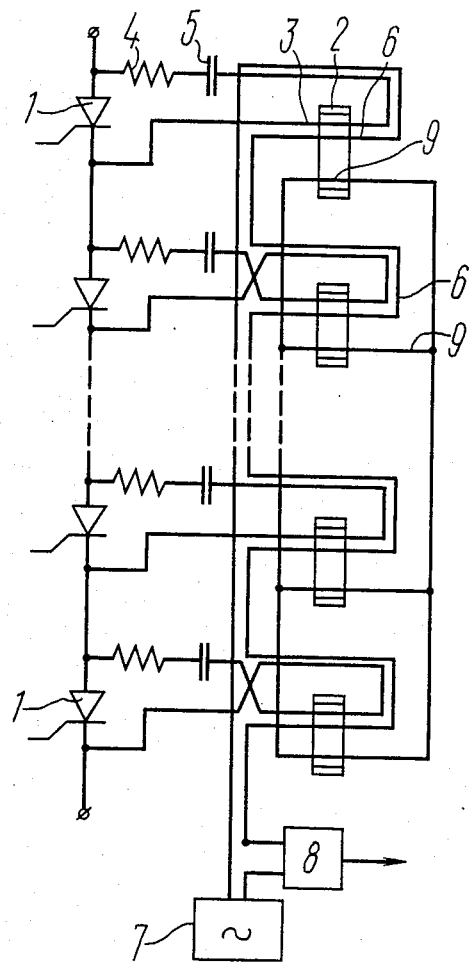

DEVICE FOR FAILURE DETECTION IN SERIES-CONNECTED SEMICONDUCTOR RECTIFIERS

TECHNICAL FIELD

This invention relates to power converters and, in particular, to devices for failure detection in series-connected semiconductor rectifiers.

BACKGROUND ART

Heavy-duty high-voltage semiconductor converters are becoming increasingly popular in various fields of application in science and technology. They are used in AC electric drives with induction and synchronous motors, in stabilized power supplies, in plasma-jet electron-ion technology, in power supply systems for electrophysical research, and other various fields.

Application of powerful high-voltage semiconductor converters in these fields offers the advantages of improved technological processes, automation of such processes, efficient use of electric power, minimization of losses of this electric power.

One common feature of heavy-duty converters rated for 3–20 kV consists in the use of series-connected semiconductor rectifiers. Such semiconductor rectifiers are extremely sensitive to overloads because of their small size, minor heat capacity, and insufficient reserve of electrical strength. Special techniques and means for protection of semiconductor rectifiers should be developed for efficient troubleshooting as part of their maintenance.

The problem of developing failure detection devices has become a serious challenge and cannot be solved without making use of the repertoire of modern power converters. Such failure detection devices should be capable of preventing emergency processes in heavy-duty high-voltage converters, minimizing the time needed for trouble hunting, providing for preventative maintenance by few unskilled personnel, resulting in lower costs of maintenance.

Known in the art are devices for failure detection in series-connected semiconductor rectifiers (cf., for example, the USSR Inventor's Certificate No. 481 963, Cl. H 02 H 7/10; the USSR Inventor's Certificate No. 620 919, Cl. H 02 H 7/10) which comprise, in order to determine if the rectifier is broken down or not, a measuring element incorporated into the diagonal of an unbalanced bridge composed of a circuit of series-connected monitored rectifiers, each rectifier being shunted by a resistor and a resistor voltage divider. These devices realize the so-called passive failure detection technique for monitoring the series-connected semiconductor rectifiers. This technique is based on detecting a signal produced in the bridge diagonal when the balance of this bridge is upset by the breakdown of a rectifier. The accuracy and reliability of such devices are not satisfactory, since much depends on the operating conditions of the semiconductor rectifier and the magnitude of the supply voltage. Such devices, therefore, have to be individually adjusted, and, since they realize the passive detection technique, they cannot be used for failure detection in semiconductor rectifiers before the supply voltage is applied to these rectifiers. In addition, such testing devices have an extremely complicated maintenance procedure.

Also known in the art is a device (cf., for example, British Pat. No. 1,540,300 Cl. H 02 M 1/18) which also realizes the passive testing method for failure detection in series-connected semiconductor rectifiers by measuring the forward and reverse voltages across these rectifiers. This device uses optoelectronic sensors whose number is equal to that of the series-connected semiconductor rectifiers. In this manner the protection system is conductively isolated from the power portion of the converter.

The disadvantages of this device consist in that it is too complicated, requires additional logical processing of information fed from optoelectronic sensors, and comprises a large number of elements located near the rectifiers, which impairs its reliability. Faulty rectifiers cannot be detected before the supply voltage is applied.

Also known in the art is a device for controlling and failure detection of series-connected rectifiers (cf., for example, the USSR Inventor's Certificate No. 256,049, Cl. 21 d2 12/03 H 2M), comprising a pulse generator having the first lead thereof connected to a terminal of the circuit composed of series-connected supply windings of current transformers, whose number is equal to that of the rectifiers, the input winding of each transformer being connected to a cathode of a respective rectifier, and RC-circuits whose number is equal to that of the rectifiers. The noise immunity of the device is improved by installing additional transformers whose number is equal to that of the rectifiers, the cores of the first and additional transformers being arranged in symmetry to the series-connected supply windings.

This device can, in principle, provide failure detection in rectifiers irrespective of the magnitude of the supply voltage of the converter.

But the device is deficient in that the circuitry and design are overcomplicated. In addition, it is not sufficiently reliable because of the large number of series-connected elements.

DISCLOSURE OF THE INVENTION

The invention is to provide a reliable device for failure detection in series-connected semiconductor rectifiers, which is capable of detecting failures of rectifiers irrespective of the magnitude of the supply voltage and operational conditions of the converter by altering the circuit of the transformer and inserting a measuring element.

This object is achieved in that in a device for failure detection in series-connected semiconductor rectifiers, comprising a pulse generator, RC-circuits whose number is equal to that of the rectifiers and which are connected by resistors to anodes of each rectifier, and transformers whose number is equal to that of the rectifiers, the input winding of each transformer having one lead thereof connected to a cathode of a respective rectifier, while the series-connected supply windings of said transformer shave one terminal connected to a first lead of the pulse generator, according to the invention, transformers are provided with additional parallel-connected windings, and second leads of each input winding of the transformer are connected to capacitors of respective RC-circuits, while a measuring element is connected to a second lead of the pulse generator and to a second terminal of the circuit composed of the series-connected supply windings of the transformers.

The device for failure detection in semiconductor rectifiers can operate irrespective of the magnitude of the supply voltage and the converter operating conditions. This device can be used in different converters, makes them more reliable and their maintenance simpler, since faults can be detected even before supply voltage is applied to the converter.

BRIEF DESCRIPTION OF THE DRAWING

The invention will now be described in more detail, by way of example, with reference to the accompanying drawing which shows a device for failure detection in series-connected semiconductor rectifiers, according to the invention.

BEST MODE FOR CARRYING OUT THE INVENTION

A device for failure detection in series-connected semiconductor rectifiers 1 (the sole FIGURE), according to the invention, comprises transformers 2 whose number is equal to that of the series-connected rectifiers 1. Input windings 3 of each transformer 2 are connected, via resistors 4 and capacitors 5 of RC-cicuits, to the series-connected semiconductor rectifiers 1. Supply windings 6 of the transformers 2 are placed in series-aiding connection and coupled to a pulse generator 7 via a measuring element 8. Each transformer 2 is provided with an additional winding 9, and these windings 9 of all transformers are connected to one another in parallel. The input windings 3 of half the transformers 2 are connected to the semiconductor rectifiers 1 by terminals having one polarity, the input windings 3 of the other half of the transformers 2 being connected by terminals of the opposite polarity.

For clarity windings 3, 6 and 9 are shown as single-turn windings.

The device for failure detection in series-connected semiconductor rectifiers operates as follows.

The high frequency AC voltage fed from the pulse generator 7 is applied, via the measuring element 8, to the series-connected supply windings 6 of the transformers 2. When all rectifiers 1 are fault-free and deenergized, the circuits of the input windings 3 are open, and all transformers 2 operate under no-lead conditions. Current consumed by the supply windings 6, supplied by the pulse generator 7, and flowing through the measuring element 8 is, therefore, minimal.

When any of the series-connected rectifiers 1 is broken down, the input winding 3 of the respective transformer 2 becomes closed on the resistor 4, since the resistance of the capacitor 5 at the voltage frequency of the pulse generator 7 is substantially less than that of the resistor 4.

Transformers 2 are magnetically coupled due to the parallel connection of the additional windings 9, and can be thought of as a single transformer having several windings. In case of a breakdown of any rectifier 1, the load of the input winding 3 of the respective transformer 2, which is the resistor 4, may be regarded connected to the pulse generator 7 via the measuring element 8, taking into account the transformation ratio of the input winding 3 and supply windings 6. In this situation, current drawn from the pulse generator 7 increases. Increased current makes the measuring element 8 operate.

The breakdown of two or more rectifiers 1 will result in further stepwise increase in current. In this manner, a multilevel failure detection system for semiconductor rectifiers can be organized.

The resistance of the capacitor 5 at the frequency of the power supply voltage applied to the series-connected rectifiers 1 of the converter, when the rectifiers are energized, proves to be high in relation to its resistance at the frequency of the pulse generator 7. In this manner the device for failure detection in series-connected semiconductor rectifiers is isolated from the converter operation and its power supply voltage. In addition, the interference of the switching currents of the capacitors 5 of RC-circuits, which are the result of the power supply voltage, and the interference of the switching processes neutralize each other because the input windings 3 of one half of the transformers 2 are connected in opposition to the other half. The pulse generator 7 can be an RC-generator using, for example, either the Meissner or Hartley circuits. The measuring element 8 is a comparator using, for example, a standard operational amplifier.

To summarize, the device according to the invention offers the following advantages. It permits reliable failure detection in rectifier circuits irrespective of the operational conditions of the converter and the magnitude of its power supply voltage. The converter becomes more reliable, and its maintenance becomes much easier because failures of the rectifiers can be detected even before the supply voltage is applied to the converter.

It can be safely assumed that this device for rectifier failure detection, which possesses serious advantages and is uncomplicated in design, can find many applications in thyristor converters rated for 3–20 kV wherein thyristors are series-connected.

The preventive failure detection realized by the device, whereby faulty rectifiers can be detected before the converter is put into operation, combined with the simpler maintenance procedure, can become decisive factors for using the device for protection and diagnostics of such converters as, for example, heavy-duty high-voltage thyristor frequency converters for starting synchronous motors (at hydroelectric pumped storage power plants, gas-turbine plants, stove blowers, etc.), high-voltage rectifier drives of pumps, fans and compressors in power generation industry, chemical industry, stabilized controlled rectifiers for radio engineering and plasma chemistry, and many other types of converters whose failure because of poor failure detection techniques can result in serious accidents and involve dramatic losses.

Industrial Applicability

The invention can be used for protection of semiconductor converters of high power, such as controlled rectifiers, inverters, and frequency converters, rated for 3–20 kV, in which semiconductor rectifiers are connected in series, against internal short circuits when some of the series-connected semiconductor rectifiers are broken down.

The invention can also be used in diagnostic systems of such converters.

We claim:

1. A device for failure detection in series-connected semiconductor rectifiers, comprising a pulse generator, RC-circuits whose number is equal to that of said rectifiers and which are connected by resistors to anodes of each rectifier, and transformers whose number is equal to that of the rectifiers, the input winding of each transformer being connected by one lead thereof to a cathode of a respective rectifier, while the series-connected supply windings of said transformers are connected by one terminal to a first output of the pulse generator, characterized in that the transformers (2) are provided with additional parallel-connected windings (9), and second leads of each input winding (3) of the transformers (2) are connected to capacitors (5) of respective RC-circuits, a measuring element (8) being connected to a second lead of the pulse generator (7) and to a second terminal of the circuit composed of the series-connected supply windings (6) of the transformers (2).

* * * * *